United States Patent
Ma et al.

(10) Patent No.: US 9,761,175 B2
(45) Date of Patent: Sep. 12, 2017

(54) SHIFT REGISTER AND DRIVING METHOD THEREOF AS WELL AS GATE DRIVING CIRCUIT

(71) Applicant: BOE TECHNOLOGY GROUP CO., LTD., Beijing (CN)

(72) Inventors: Zhanjie Ma, Beijing (CN); Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 61 days.

(21) Appl. No.: 14/899,812

(22) PCT Filed: May 19, 2015

(86) PCT No.: PCT/CN2015/079251
§ 371 (c)(1),
(2) Date: Dec. 18, 2015

(87) PCT Pub. No.: WO2016/119342
PCT Pub. Date: Aug. 4, 2016

(65) Prior Publication Data
US 2016/0372042 A1  Dec. 22, 2016

(30) Foreign Application Priority Data
Jan. 28, 2015 (CN) .......................... 2015 1 0043666

(51) Int. Cl.
*G11C 19/00* (2006.01)
*G09G 3/3258* (2016.01)
(Continued)

(52) U.S. Cl.
CPC ............ *G09G 3/3258* (2013.01); *G09G 3/20* (2013.01); *G09G 3/3266* (2013.01);
(Continued)

(58) Field of Classification Search
None
See application file for complete search history.

(56) References Cited

U.S. PATENT DOCUMENTS

2005/0185752 A1   8/2005   Sasaki et al.
2011/0001732 A1   1/2011   Morii et al.
(Continued)

FOREIGN PATENT DOCUMENTS

CN   1758321   4/2006
CN   101388253   3/2009
(Continued)

*Primary Examiner* — Tuan T Lam
(74) *Attorney, Agent, or Firm* — Harness, Dickey & Pierce, P.L.C.

(57) ABSTRACT

A shift register is proposed, comprising: a first control module connected to an ON voltage access terminal and a first node, for controlling whether to output an ON voltage and a first control signal to the first node; a second control module connected to the ON voltage access terminal, a second node and an output terminal, for controlling whether to output the ON voltage and a voltage of the output terminal to the second node; an output module connected to the first node, the second node, the output terminal, an OFF voltage access terminal, and the ON voltage access terminal, for inputting the ON or OFF voltage to the output terminal according to voltages of the first and second nodes; and an input module connected to an input terminal, for controlling whether to input a signal of the input terminal to the first and second control modules.

13 Claims, 2 Drawing Sheets

(51) Int. Cl.
 *G09G 3/20* (2006.01)
 *G11C 19/28* (2006.01)
 *G09G 3/36* (2006.01)
 *G09G 3/3266* (2016.01)
 *G11C 19/18* (2006.01)

(52) U.S. Cl.
 CPC ......... *G09G 3/3648* (2013.01); *G09G 3/3677* (2013.01); *G11C 19/184* (2013.01); *G11C 19/28* (2013.01); *G09G 2300/0426* (2013.01); *G09G 2310/0267* (2013.01); *G09G 2310/0286* (2013.01); *G09G 2310/08* (2013.01); *G09G 2320/0209* (2013.01)

(56) References Cited

U.S. PATENT DOCUMENTS

2012/0163529 A1* 6/2012 Chen ...................... G11C 19/28
 377/75

2016/0117963 A1* 4/2016 Chung ................. G09G 3/3208
 345/208
2016/0133184 A1* 5/2016 Gupta ................. G09G 3/3233
 345/690
2016/0232865 A1* 8/2016 Hao ...................... G09G 3/3677
2016/0314745 A1* 10/2016 Hu ....................... G09G 3/3266

FOREIGN PATENT DOCUMENTS

| | | |
|---|---|---|
| CN | 101939791 | 1/2011 |
| CN | 102682699 | 9/2012 |
| CN | 103151010 | 6/2013 |
| CN | 103236248 | 8/2013 |
| CN | 103295641 | 9/2013 |
| CN | 103971628 | 8/2014 |
| CN | 104299595 | 1/2015 |
| CN | 104537979 | 4/2015 |
| JP | 2003346492 | 12/2003 |
| KR | 100804038 | 2/2008 |

* cited by examiner

SHIFT REGISTER AND DRIVING METHOD THEREOF AS WELL AS GATE DRIVING CIRCUIT

TECHNICAL FIELD

The present invention belongs to the field of gate driving technology, and particularly relates to a shift register and a driving method thereof as well as a gate driving circuit.

BACKGROUND

In array substrates of liquid crystal display devices, organic light emitting diode (OLED) display devices or the like, gate lines may be controlled by gate driving circuits (GOA). A gate driving circuit comprises a plurality of cascaded shift registers, which are controlled via clock signals of one or more pulses. Where, the output terminal of each level of shift register is connected to a gate line, and is connected to the input terminal of its next level of shift register, and when a certain level of shift register outputs an ON voltage, it will also trigger the next level of shift register so that the next level of shift register outputs an ON voltage in the next moment, thereby achieving the purpose of alternate ON of each gate line.

In an existing shift register, the output of signal is controlled by a transistor, and the gate of the transistor is directly or indirectly controlled by a clock signal. Since the transistor is not the ideal device and has parasitic capacitance and other issues, the pulse of the clock signal on its gate will cause unstable outputs of the shift register.

SUMMARY

With respect to the problem that the output of an existing shift register is unstable due to the influence from a clock signal, the present invention provides a shift register with stable outputs and a driving method thereof, and a gate driving circuit.

The technical solution adopted for solving the technical problem of the present invention is a shift register, which comprises:

a first control module connected to an ON voltage access terminal, a first control signal access terminal, a constant voltage access terminal and a first node, for controlling whether to output an ON voltage and a first control signal to the first node;

a second control module connected to the ON voltage access terminal, the first control signal access terminal, a second control signal access terminal, the constant voltage access terminal, a second node and an output terminal, for controlling whether to output the ON voltage and a voltage of the output terminal to the second node;

an output module connected to the first node, the second node, the output terminal, an OFF voltage access terminal, and the ON voltage access terminal, for inputting the ON voltage or an OFF voltage to the output terminal according to voltages of the first node and of the second node; and an input module connected to an input terminal, the first control signal access terminal, the first control module, and the second control module, for controlling whether to input a signal of the input terminal to the first control module and to the second control module.

According to the embodiment of the invention, the first control module comprises: a first transistor, a second transistor, and a first capacitor; wherein the first transistor has a gate connected to the first control signal access terminal, a first electrode connected to the ON voltage access terminal and a second electrode connected to the first node; the second transistor has a gate connected to the input module, a first electrode connected to the first node and a second electrode connected to the first control signal access terminal; and the first capacitor has a first electrode connected to the constant voltage access terminal and a second electrode connected to the first node.

According to the embodiment of the invention, the second control module comprises: a third transistor, a fourth transistor, a fifth transistor, a second capacitor, and a third capacitor; wherein the third transistor has a gate connected to the second control signal access terminal, a first electrode connected to a second electrode of the fourth transistor and a second electrode connected to the ON voltage access terminal; the fourth transistor has a gate connected to the input module and a first electrode connected to the second node; the fifth transistor has a gate connected to the first control signal access terminal, a first electrode connected to the second node and a second electrode connected to the output terminal; the second capacitor has a first electrode connected to the constant voltage access terminal and a second electrode connected to the input module; and the third capacitor has a first electrode connected to the second node and a second electrode connected to the output terminal.

According to the embodiment of the invention, the output module comprises: a sixth transistor, and a seventh transistor; wherein the sixth transistor has a gate connected to the first node, a first electrode connected to the OFF voltage access terminal and a second electrode connected to the output terminal; and the seventh transistor has a gate connected to the second node, a first electrode connected to the output terminal and a second electrode connected to the ON voltage access terminal.

According to the embodiment of the invention, the input module comprises an eighth transistor, wherein the eighth transistor has a gate connected to the first control signal access terminal, a first electrode connected to the input terminal and a second electrode connected to the gate of the second transistor, the gate of the fourth transistor and the second electrode of the second capacitor.

According to the embodiment of the invention, the first to eighth transistors are P-type transistors; the ON voltage is a low-level signal, and the OFF voltage is a high-level signal.

According to the embodiment of the invention, the first to eighth transistors are N-type transistors, the ON voltage is a high-level signal, and the OFF voltage is a low-level signal.

According to the embodiment of the invention, the constant voltage access terminal is connected to the ON voltage access terminal or the OFF voltage access terminal.

The technical solution adopted for solving the technical problem of the present invention is a driving method for the shift register described above, comprising:

a triggering stage to input the ON voltage to the first node so as to input the OFF voltage to the output terminal, and to input the voltage of the output terminal to the second node;

an ON voltage output stage to input a first control signal to the first node, and to input the ON voltage to the second node so as to input the ON voltage to the output terminal;

an OFF voltage output stage to keep the ON voltage at the first node, and to keep the OFF voltage at the second node so as to input the OFF voltage to the output terminal.

According to the embodiment of the invention, the shift register is the shift register adopting P-type transistor described above, and the driving method for the shift register comprises: a triggering stage to input a low-level signal at the input terminal and the first control signal access terminal and to input a high-level signal at the second control signal access terminal; an ON voltage output stage to input a high-level signal at the input terminal and the first control signal access terminal, and to input a low-level signal at the second control signal access terminal; an OFF voltage output stage including in cycle a first sub-stage to input a high-level signal at the input terminal and the second control signal access terminal and to input a low-level signal at the first control signal access terminal and a second sub-stage to input a high-level signal at the input terminal and the first control signal access terminal and to input a low-level signal at the second control signal access terminal.

According to the embodiment of the invention, the shift register is the shift register adopting N-type transistor described above, and the driving method for the shift register comprises: a triggering stage to input a high-level signal at the input terminal and the first control signal access terminal and to input a low-level signal at the second control signal access terminal; an ON voltage output stage to input a low-level signal at the input terminal and the first control signal access terminal, and to input a high-level signal at the second control signal access terminal; an OFF voltage output stage including in cycle a first sub-stage to input a low-level signal at the input terminal and the second control signal access terminal and to input a high-level signal at the first control signal access terminal and a second sub-stage to input a low-level signal at the input terminal and the first control signal access terminal and to input a high-level signal at the second control signal access terminal.

The technical solution adopted for solving the technical problem of the present invention is a gate driving circuit, comprising:

a plurality of cascaded shift registers, the shift registers being the shift registers described above.

According to the embodiment of the invention, for any two adjacent levels of shift registers, one shift register has the first control signal access terminal connected to a first clock signal and the second control signal access terminal connected to a second clock signal, and the other shift register has the first control signal access terminal connected to the second clock signal and the second control signal access terminal connected to the first clock signal.

The output of the shift register of the present invention is controlled by the voltages of the first node and of the second node, while the voltages of these two nodes may be set as a stable ON voltage or OFF voltage, instead of a pulse voltage, so that the voltage outputted by the shift register is not interfered by the clock signal and is relatively stable; at the same time, the voltage outputted by the shift register may also be set as an ON voltage or an OFF voltage, instead of the voltage obtained by the clock signal, which further ensures the stability of the voltage outputted by the shift register.

Wherein, reference signs are as follows: 100, a first control module; 101, a second control module; 102, an output module; 103, an input module; A, a first node; B, a second node; M1, a first transistor; M2, a second transistor; M3, a third transistor; M4, a fourth transistor; M5, a fifth transistor; M6, a sixth transistor; M7, a seventh transistor; M8, an eighth transistor; C1, a first capacitor; C2, a second capacitor; C3, a third capacitor; VK, an ON voltage access terminal; VG, an OFF voltage access terminal; VD, a constant voltage access terminal; K1, a first control signal access terminal; K2, a second control signal access terminal; OUT, an output terminal; IN, an input terminal.

DETAILED DESCRIPTION

To enable those skilled in the art to better understand the technical solution of the present invention, the present invention will be further described in detail below in combination with the accompanying drawings and specific embodiments.

Embodiment 1

As shown in from FIG. 1 to FIG. 4, the present embodiment provides a shift register, and a plurality of such cascaded shift registers may form a gate driving circuit for driving gate lines in array substrates of various types of display devices.

Figure 1:
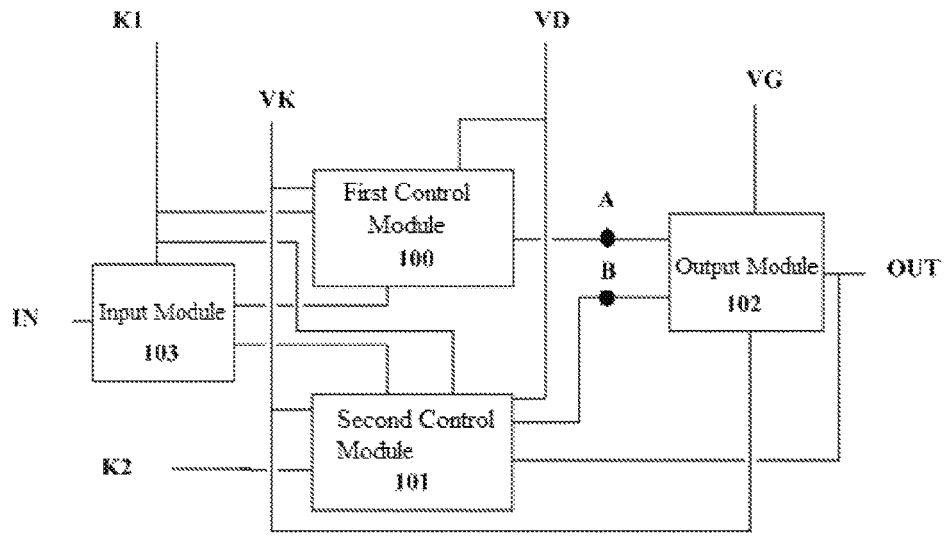
FIG. 1 is a schematic diagram of a module structure of a shift register according to an embodiment of the invention.

As shown in FIG. 1, the shift register of the present embodiment comprises:

a first control module 100 connected to an ON voltage access terminal VK, a first control signal access terminal K1, a constant voltage access terminal VD and a first node A, for controlling whether to output an ON voltage and a first control signal to the first node A;

a second control module 101 connected to the ON voltage access terminal VK, the first control signal access terminal K1, a second control signal access terminal K2, the constant voltage access terminal VD, a second node B and an output terminal OUT, for controlling whether to output the ON voltage and a voltage of the output terminal to the second node B;

an output module 102 connected to the first node A, the second node B, the output terminal OUT, an OFF voltage access terminal VG, the ON voltage access terminal VK, for inputting the ON voltage or an OFF voltage to the output terminal OUT according to voltages of the first node A and of the second node B; and an input module 103 connected to an input terminal IN, the first control signal access terminal K1, the first control module 100, and the second control module 101, for controlling whether to input a signal of the input terminal IN to the first control module 100 and the second control module 101.

The voltage outputted by the shift register of the embodiment is controlled by the voltages of the first node A and of the second node B, while the voltages of these two nodes may be set as a stable ON voltage or OFF voltage, instead of pulse voltage, so that the voltage outputted by the shift register is not interfered by the clock signal and is relatively stable; at the same time, the voltage outputted by the shift register may also be set as an ON voltage or an OFF voltage, instead of the voltage obtained by the clock signal, which further ensures the stability of the voltage outputted by the shift register.

Figure 2:
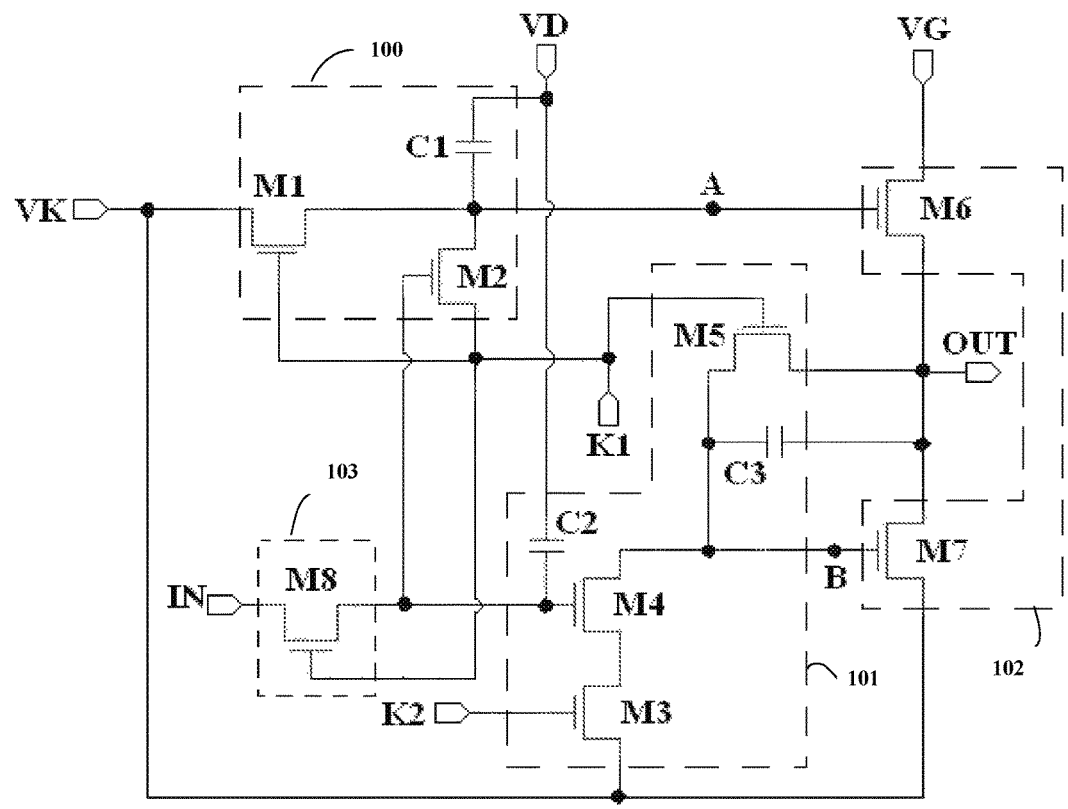
FIG. 2 is a circuit diagram of the shift register according to the embodiment of the invention.

Specifically, as shown in FIG. 2, the first control module 100 comprises: a first transistor M1, a second transistor M2, and a first capacitor C1; wherein the first transistor M1 has a gate connected to the first control signal access terminal K1, a first electrode connected to the ON voltage access terminal VK and a second electrode connected to the first node A;

the second transistor M2 has a gate connected to the input module 103, a first electrode connected to the first node A and a second electrode connected to the first control signal access terminal K1; and the first capacitor C1 has a first electrode connected to the constant voltage access terminal VD and a second electrode connected to the first node A.

The second control module 101 comprises: a third transistor M3, a fourth transistor M4, a fifth transistor M5, a second capacitor C2, and a third capacitor C3; wherein the third transistor M3 has a gate connected to the second control signal access terminal K2, a first electrode connected to a second electrode of the fourth transistor M4 and a second electrode connected to the ON voltage access terminal VK;

the fourth transistor M4 has a gate connected to the input module 103 and a first electrode connected to the second node B;

the fifth transistor M5 has a gate connected to the first control signal access terminal K1, a first electrode connected to the second node B and a second electrode connected to the output terminal OUT;

the second capacitor C2 has a first electrode connected to the constant voltage access terminal VD and a second electrode connected to the input module 103; and the third capacitor C3 has a first electrode connected to the second node B and a second electrode connected to the output terminal OUT.

The output module 102 comprises: a sixth transistor M6, and a seventh transistor M7; wherein, the sixth transistor M6 has a gate connected to the first node A, a first electrode connected to the OFF voltage access terminal VG and a second electrode connected to the output terminal OUT; and the seventh transistor M7 has a gate connected to the second node B, a first electrode connected to the output terminal OUT and a second electrode connected to the ON voltage access terminal VK.

The input module 103 comprises an eighth transistor M8, wherein, the eighth transistor M8 has a gate connected to the first control signal access terminal K1, a first electrode connected to the input terminal IN and a second electrode connected to the gate of the second transistor M2, the gate of the fourth transistor M4 and the second electrode of the second capacitor C2.

Wherein, as long as being connected to a constant voltage source and obtaining a stable voltage input, the constant voltage access terminal VD may prevent the voltage outputted by the shift register from being interfered by a clock signal and is relatively stable. According to the embodiment of the invention, the constant voltage access terminal VD is connected to the ON voltage access terminal VK or the OFF voltage access terminal VG.

This is because the voltage of the ON voltage access terminal VK or the OFF voltage access terminal VG is a constant ON or OFF voltage and it may be used as a constant voltage source, without adding additional ports separately, thereby simplifying wiring. Thus, the voltage outputted by the shift register is a constant ON or OFF voltage, implementing the stability of the voltage outputted by the shift register.

Wherein, as one manner of the present embodiment, the above first to eighth transistors M1-M8 are P-type transistors, and since the P-type transistors are ON at a low-level gate voltage, and OFF at a high-level gate voltage, the above ON voltage is a low-level signal, and the OFF voltage is a high-level signal. Accordingly, the ON voltage outputted by the shift register is a low-level signal, and the OFF voltage is a high-level signal, whereby transistors connected by gate lines driven by it shall also be ON at a low-level gate voltage and OFF at a high-level gate voltage, that is, shall also be P-type transistors.

Alternatively, as a manner of the present embodiment, the above first to eighth transistors M1-M8 are N-type transistors, and since the N-type transistors are ON at a high-level gate voltage, and OFF at a low-level gate voltage, the ON voltage at the time is a high-level signal, and the OFF voltage is a low-level signal. Of course, transistors connected by gate lines driven by the shift register at the time shall also be N-type transistors.

This embodiment also provides a driving method for the shift register described above, comprising:

a triggering stage to input the ON voltage to the first node A so as to input the OFF voltage to the output terminal OUT, and to input the voltage of the output terminal OUT to the second node B;

an ON voltage output stage to input a first control signal to the first node A, and to input the ON voltage to the second node B so as to input the ON voltage to the output terminal OUT;

an OFF voltage output stage to keep the ON voltage at the first node A, and to keep the OFF voltage at the second node B so as to input the OFF voltage to the output terminal OUT.

Figure 3:
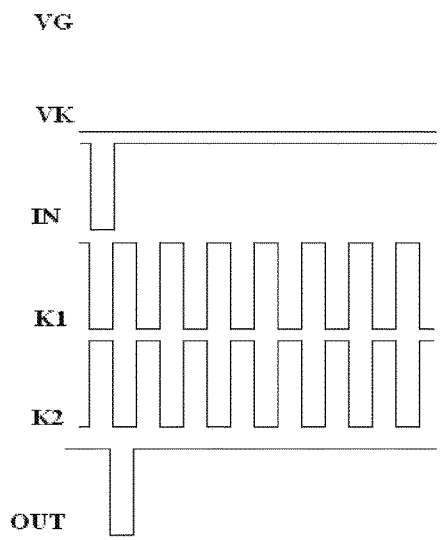
FIG. 3 is a signal timing diagram of each port of the shift register according to the embodiment of the invention.

According to the embodiment of the invention, by example of the case where the above first to eighth transistors M1-M8 are P-type transistors, the driving method and work principle of the shift register of the present invention are introduced. Where, as shown in FIG. 3, at the time, a constant low level signal is inputted to the ON voltage access terminal VK, while a constant high-level input signal is inputted to the OFF voltage access terminal VG, while the driving method of the shift register specifically comprises:

S101, a triggering stage: to input a low-level signal at the input terminal IN and the first control signal access terminal K1, and to input a high-level signal at the second control signal access terminal K2.

At this stage, a low-level signal is inputted at the first control signal access terminal K1, so that the eighth transistor M8 is turned on. The low-level signal at the input signal IN is transmitted via the eighth transistor M8 to the gates of the second transistor M2 and of the fourth transistor M4 so that they are turned on, while the voltage of the second electrode (the electrode in the lower side in the figure) of the second capacitor C2 is changed to a low-level signal. Since the high-level signal of the second control signal access terminal K2 turns off the third transistor M3, there is no current flowing through the fourth transistor M4.

The low-level signal of the first control signal access terminal K1 also turns on the first transistor M1, whereby the ON voltage signal (i.e. the low-level signal) is conducted through the first transistor M1 to the first node A, the low-level signal of the first control signal access terminal K1 is also conducted through the second transistor M2 to the first node A, so that the voltage of the first node A is stabilized as a low-level signal, while a low-level signal is also loaded to the second electrode of the first capacitor C1 (the electrode on the lower side in the figure). Thus, the sixth transistor M6 is turned on, the OFF voltage of the OFF voltage access terminal VG (i.e., a high-level signal) is conducted through the sixth transistor M6 to the output terminal OUT, and the shift register outputs an OFF voltage for turning off the transistor.

The low-level signal of the first control signal access terminal K1 also turns on the fifth transistor M5, whereby the high-level signal of the output terminal OUT will also be conducted through the fifth transistor M5 to the second node B, thereby controlling the stable OFF of the seventh transistor M7 to prevent the signal of the ON voltage access terminal VK from influencing the voltage of the output terminal OUT.

S102, an ON voltage output stage: to input a high-level signal at the input terminal IN and the first control signal access terminal K1 and to input a low-level signal at the second control signal access terminal K2.

At this stage, the eighth transistor M8 is turned off by the high-level signal of the first control signal access terminal K1, whereby the second electrode of the second capacitor C2 cannot be discharged while remaining the previous low-level signal, and the fourth transistor M4 also remains ON, and meanwhile the signal of the second control signal access terminal K2 becomes a low-level signal to turn on the third transistor M3, so that the ON voltage of the ON voltage access terminals VK is conducted through the third transistor M3 and the fourth transistor M4 to the second node B to turn on the seventh transistor M7, the ON voltage of the ON voltage access terminal VK is conducted to the output terminal OUT, and the shift register outputs the ON voltage (i.e. a low-level signal).

Meanwhile, the second capacitor C2 also makes the second transistor M2 keep ON while the high-level signal of the first control signal access terminal K1 makes the first transistor M1 off, so that the high-level signal of the first control signal access terminal K1 is conducted through the second transistor M2 to the first node A, so that the sixth transistor M6 is turned off stably, to prevent the OFF voltage from influencing the voltage of the output terminal OUT.

S103, an OFF voltage output stage, which comprises a first sub-stage and a second sub-stage in cycle. Wherein, the first sub-stage and second sub-stage in cycle means that after the ON voltage output stage ends, the shift register starts to work in turn continuously in accordance with "the first sub-stage—the second sub-stage—the first sub-stage—the second sub-stage . . . ", until entering the triggering stage again.

At the first sub-stage, a high-level signal is inputted at the input terminal IN and the second control signal access terminal K2, and a low-level signal is inputted at the first control signal access terminal K1.

Wherein the low-level signal of the first control signal access terminal K1 turns on the eighth transistor M8 to introduce the high-level signal of the input terminal IN to the gate of the fourth transistor M4 and to charge the second capacitor C2, while because the high-level signal of second control signal access terminal K2 turns off the third transistor M3, there is no current in the fourth transistor M4. The low-level signal of the first control signal access terminal K1 also turns on the first transistor M1, whereby the ON voltage of the ON voltage access terminal VK is inputted to the first node A to turn on the sixth transistor M6 and input the OFF voltage of the OFF voltage access terminal VG to the output terminal OUT, and the shift register outputs the OFF voltage (a high-level signal).

Meanwhile, the low-level signal of the first control signal access terminal K1 also turns on the fifth transistor M5 to introduce the high-level signal of the output terminal OUT to the second node B and to ensure the stable OFF of the seventh transistor M7. Meanwhile, a high-level signal is also loaded to the two electrodes of the third capacitor C3.

At the second sub-stage, a high-level signal is inputted at the input terminal IN and the first control signal access terminal K1, and a low-level signal is inputted at the second control signal access terminal K2.

Wherein the high-level signal of the first control signal access terminal K1 turns off the fifth transistor M5, the first transistor M1 and the eighth transistor M8, whereby the gate of the fourth transistor M4 keeps a high-level signal at the first sub-stage through the second capacitor C2, and the fourth transistor M4 is still turned off, and the first electrode of the third capacitor C3 (the electrode on the left side in the figure) cannot be discharged, so as to keep the voltage of the second node B as a high-level signal and stably turn off the seventh transistor M7.

Meanwhile, since the first transistor M1 is turned off, and the gate of the second transistor M2 is connected to the second electrode of the second capacitor C2 and the second transistor M2 also remains off, the first capacitor C1 cannot be discharged and its second electrode remains a low-level signal, that is, the first node A remains a low-level signal to turn on the sixth transistor M6 stably, and to output the OFF voltage to the output terminal OUT, and the output terminal OUT remains the OFF voltage, and the shift register continuously outputs OFF voltage (a high-level signal).

As it can be seen, in the two sub-stages hereinabove, although the control signals are different, the shift register may always output OFF voltage stably, whereby as the first control signal and the second control signal change, the shift register continuously switches between the first sub-stage and the second sub-stage until the signal of the input terminal IN becomes a low-level signal again, and the shift register re-enters the triggering stage and starts another work cycle.

As it can be seen, in the shift register of the present embodiment, the voltages of the first node A and of the second node B for controlling the output are either ON voltage/OFF voltage through direct access, or stable voltage remained by the capacitors, without being influenced by the pulse signal; meanwhile, the voltage actually outputted is also generated by a constant ON voltage/OFF voltage, instead of being generated by the pulse voltage; thus, the shift register prevents the pulse signal (clock signals) from influencing the output to the greatest extent, and may keep stable output as much as possible.

Figure 4:
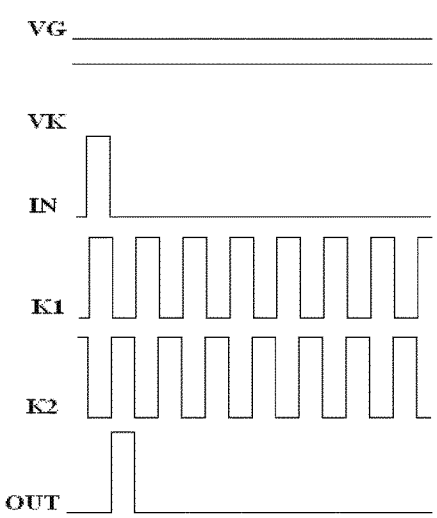
FIG. 4 is a signal timing diagram of each port of another shift register according to the embodiment of the invention.

The driving method hereinabove is introduced by example of the case where the first to eighth transistors M1-M8 are P-type transistors. If the first to eighth transistors M1-M8 are N-type transistors, as shown in FIG. 4, a constant high-level signal is inputted at the ON voltage access terminal VK while a constant low-level signal is inputted at the OFF voltage access terminal VG, and the driving method specifically comprises:

S201, a triggering stage: to input a high-level signal at the input terminal IN and the first control signal access terminal K1, and to input a low-level signal at the second control signal access terminal K2.

S202, an ON voltage output stage: to input a low-level signal at the input terminal IN and the first control signal access terminal K1 and to input a high-level signal at the second control signal access terminal K2;

S203, an OFF voltage output stage, which comprises a first sub-stage and a second sub-stage in cycle; at the first sub-stage, a low-level signal is inputted at the input terminal IN and the second control signal access terminal K2, and a high-level signal is inputted at the first control signal access terminal K1; at the second sub-stage, a low-level signal is inputted at the input terminal IN and the first control signal access terminal K1, and a high-level signal is inputted at the second control signal access terminal K2

Obviously, when all types of transistors in the shift register change from P-type into N-type, the voltages required for ON and OFF are also just reversed; therefore, as long as high-levels and low-levels of all driving signals are inverted, that is, it can be guaranteed that all the states of the transistors in each stage do not change, and the driving of the shift register is implemented. Since the work procedure is completely the same as when all the transistors are P-type, it is not described in detail here any more.

This embodiment also provides a gate driving circuit, which comprises a plurality of cascaded shift registers described above.

That is, a plurality of shift registers may be successively connected to form the gate driving circuit, wherein an output terminal OUT of a certain level of shift register is not only connected to the gate line for driving, but also connected to the input terminal IN of the next level of shift register to use the ON voltage outputted by it as an input signal making the next level of shift register enter the triggering stage.

Wherein, for the first level of shift register, its input terminal IN may be connected to a special ON voltage terminal (STV), and may also be connected to an output terminal OUT of the last level of shift register.

According to the embodiment of the invention, for any two adjacent levels of shift registers, one shift register has the first control signal access terminal K1 connected to a first clock signal and the second control signal access terminal K2 connected to a second clock signal.

The other shift register has the first control signal access terminal K1 connected to a second clock signal and the second control signal access terminal K2 connected to the first clock signal.

That is, for any two adjacent levels of shift registers, the signals connected by the same control signal access terminal are opposite. It can be seen from FIG. 3 and FIG. 4 that the signal of the output terminal OUT of a certain level of shift register is different from the signal of the input terminal IN just in one stage of waveform, while the signal of the output terminal OUT is the signal of the input terminal IN of the next level of shift register, whereby for the next level of shift register, if its two control signals are the same as the control signals of the higher level of shift register, then the voltages of the control signals in each stage are just opposite to the required voltage. To this end, the locations of the two control signals may be interchanged in this level of shift register, so that the control of all shift registers may be implemented with only two clock signals, simplifying the required circuit. Of course, is also feasible not to use the manner abovementioned but to set different clock signals for different shift registers.

It is appreciated that the above embodiment is merely an exemplary embodiment to illustrate the principles of the present invention, but the present invention is not limited thereto. Without departing from the spirit and essence of the present invention, those of ordinary skill in the art may make various variants and improvements, while these variants and improvements are also construed as the scope of the invention.

What is claimed is:
1. A shift register, comprising:
a first control module connected to an ON voltage access terminal, a first control signal access terminal, a constant voltage access terminal and a first node, for controlling whether to output an ON voltage and a first control signal to the first node;
a second control module connected to the ON voltage access terminal, the first control signal access terminal, a second control signal access terminal, the constant voltage access terminal, a second node and an output terminal, for controlling whether to output the ON voltage and a voltage of the output terminal to the second node;
an output module connected to the first node, the second node, the output terminal, an OFF voltage access terminal, and the ON voltage access terminal, for inputting the ON voltage or the OFF voltage to the output terminal according to voltages of the first node and of the second node; and
an input module connected to an input terminal, the first control signal access terminal, the first control module, and the second control module, for controlling whether to input a signal of the input terminal to the first control module and to the second control module.

2. The shift register of claim 1, wherein the first control module comprises a first transistor, a second transistor, and a first capacitor; wherein
the first transistor has a gate connected to the first control signal access terminal, a first electrode connected to the ON voltage access terminal and a second electrode connected to the first node;
the second transistor has a gate connected to the input module, a first electrode connected to the first node and a second electrode connected to the first control signal access terminal; and
the first capacitor has a first electrode connected to the constant voltage access terminal and a second electrode connected to the first node.

3. The shift register of claim 2, wherein the second control module comprises a third transistor, a fourth transistor, a fifth transistor, a second capacitor, and a third capacitor; wherein
the third transistor has a gate connected to the second control signal access terminal, a first electrode connected to a second electrode of the fourth transistor and a second electrode connected to the ON voltage access terminal;
the fourth transistor has a gate connected to the input module and a first electrode connected to the second node;
the fifth transistor has a gate connected to the first control signal access terminal, a first electrode connected to the second node and a second electrode connected to the output terminal;
the second capacitor has a first electrode connected to the constant voltage access terminal and a second electrode connected to the input module; and
the third capacitor has a first electrode connected to the second node and a second electrode connected to the output terminal.

4. The shift register of claim 3, wherein the output module comprises a sixth transistor, and a seventh transistor; wherein
the sixth transistor has a gate connected to the first node, a first electrode connected to the OFF voltage access terminal and a second electrode connected to the output terminal; and the seventh transistor has a gate connected to the second node, a first electrode connected to the output terminal and a second electrode connected to the ON voltage access terminal.

5. The shift register of claim 4, wherein the input module comprises an eighth transistor, wherein the eighth transistor has a gate connected to the first control signal access terminal, a first electrode connected to the input terminal and a second electrode connected to the gate of the second transistor, the gate of the fourth transistor and the second electrode of the second capacitor.

6. The shift register of claim 5, wherein
the first to eighth transistors are P-type transistors; and
the ON voltage is a low-level signal, and the OFF voltage is a high-level signal.

7. The shift register of claim 5, wherein
the first to eighth transistors are N-type transistors; and
the ON voltage is a high-level signal, and the OFF voltage is a low-level signal.

8. The shift register of claim 1, wherein
the constant voltage access terminal is connected to the ON voltage access terminal or the OFF voltage access terminal.

9. A driving method for a shift register, wherein the shift register is the shift register of claim 1, comprising:

a triggering stage to input the ON voltage to the first node so as to input the OFF voltage to the output terminal, and to input the voltage of the output terminal to the second node;

an ON voltage output stage to input the first control signal to the first node, and to input the ON voltage to the second node so as to input the ON voltage to the output terminal; and an OFF voltage output stage to keep the ON voltage at the first node, and to keep the OFF voltage at the second node so as to input the OFF voltage to the output terminal.

10. The driving method for a shift register of claim 9, wherein the first control module comprises a first transistor, a second transistor, and a first capacitor; the second control module comprises a third transistor, a fourth transistor, a fifth transistor, a second capacitor, and a third capacitor; the output module comprises a sixth transistor, and a seventh transistor; and the input module comprises an eighth transistor; wherein the first transistor has a gate connected to the first control signal access terminal, a first electrode connected to the ON voltage access terminal and a second electrode connected to the first node;

the second transistor has a gate connected to the input module, a first electrode connected to the first node and a second electrode connected to the first control signal access terminal;

the first capacitor has a first electrode connected to the constant voltage access terminal and a second electrode connected to the first node;

the third transistor has a gate connected to the second control signal access terminal, a first electrode connected to a second electrode of the fourth transistor and a second electrode connected to the ON voltage access terminal;

the fourth transistor has a gate connected to the input module and a first electrode connected to the second node;

the fifth transistor has a gate connected to the first control signal access terminal, a first electrode connected to the second node and a second electrode connected to the output terminal;

the second capacitor has a first electrode connected to the constant voltage access terminal and a second electrode connected to the input module;

the third capacitor has a first electrode connected to the second node and a second electrode connected to the output terminal;

the sixth transistor has a gate connected to the first node, a first electrode connected to the OFF voltage access terminal and a second electrode connected to the output terminal;

the seventh transistor has a gate connected to the second node, a first electrode connected to the output terminal and a second electrode connected to the ON voltage access terminal; and the eighth transistor has a gate connected to the first control signal access terminal, a first electrode connected to the input terminal and a second electrode connected to the gate of the second transistor, the gate of the fourth transistor and the second electrode of the second capacitor; wherein the first to eighth transistors are P-type transistors; and
the ON voltage is a low-level signal, and the OFF voltage is a high-level signal;

and the driving method for the shift register specifically comprising:

a triggering stage to input a low-level signal at the input terminal and the first control signal access terminal and to input a high-level signal at the second control signal access terminal;

an ON voltage output stage to input a high-level signal at the input terminal and the first control signal access terminal, and to input a low-level signal at the second control signal access terminal;

an OFF voltage output stage including in cycle a first sub-stage to input a high-level signal at the input terminal and the second control signal access terminal and to input a low-level signal at the first control signal access terminal and a second sub-stage to input a high-level signal at the input terminal and the first control signal access terminal and to input a low-level signal at the second control signal access terminal.

11. The driving method for a shift register of claim 9, wherein the first control module comprises a first transistor, a second transistor, and a first capacitor; the second control module comprises a third transistor, a fourth transistor, a fifth transistor, a second capacitor, and a third capacitor; the output module comprises a sixth transistor, and a seventh transistor; and the input module comprises an eighth transistor; wherein the first transistor has a gate connected to the first control signal access terminal, a first electrode connected to the ON voltage access terminal and a second electrode connected to the first node;

the second transistor has a gate connected to the input module, a first electrode connected to the first node and a second electrode connected to the first control signal access terminal;

the first capacitor has a first electrode connected to the constant voltage access terminal and a second electrode connected to the first node;

the third transistor has a gate connected to the second control signal access terminal, a first electrode connected to a second electrode of the fourth transistor and a second electrode connected to the ON voltage access terminal;

the fourth transistor has a gate connected to the input module and a first electrode connected to the second node;

the fifth transistor has a gate connected to the first control signal access terminal, a first electrode connected to the second node and a second electrode connected to the output terminal;

the second capacitor has a first electrode connected to the constant voltage access terminal and a second electrode connected to the input module;

the third capacitor has a first electrode connected to the second node and a second electrode connected to the output terminal;

the sixth transistor has a gate connected to the first node, a first electrode connected to the OFF voltage access terminal and a second electrode connected to the output terminal;

the seventh transistor has a gate connected to the second node, a first electrode connected to the output terminal and a second electrode connected to the ON voltage access terminal; and the eighth transistor has a gate connected to the first control signal access terminal, a first electrode connected to the input terminal and a second electrode connected to the gate of the second transistor, the gate of the fourth transistor and the second electrode of the second capacitor; wherein the first to eighth transistors are N-type transistors; and the ON voltage is a high-level signal, and the OFF voltage is a low-level signal;

and the driving method for the shift register specifically comprising:

a triggering stage to input a high-level signal at the input terminal and the first control signal access terminal and to input a low-level signal at the second control signal access terminal;

an ON voltage output stage to input a low-level signal at the input terminal and the first control signal access terminal, and to input a high-level signal at the second control signal access terminal;

an OFF voltage output stage including in cycle a first sub-stage to input a low-level signal at the input terminal and the second control signal access terminal and to input a high-level signal at the first control signal access terminal and a second sub-stage to input a low-level signal at the input terminal and the first control signal access terminal and to input a high-level signal at the second control signal access terminal.

12. A gate driving circuit, comprising:

a plurality of cascaded shift registers, the shift registers being the shift registers of claim 1.

13. The gate driving circuit of claim 12, wherein for any two adjacent levels of shift registers, one shift register has the first control signal access terminal connected to a first clock signal and the second control signal access terminal connected to a second clock signal; and the other shift register has the first control signal access terminal connected to the second clock signal and the second control signal access terminal connected to the first clock signal.

\* \* \* \* \*